(12) United States Patent
Wang (10) Patent No.: US 11,711,021 B2
(45) Date of Patent: Jul. 25, 2023

(54) SWITCHING CIRCUIT WITH CONTROLLABLE ACTIVE CLAMP FUNCTION

(71) Applicant: LSC Ecosystem Corporation, Taoyuan (TW)

(72) Inventor: Chang-Ming Wang, Taipei (TW)

(73) Assignee: LSC Ecosystem Corporation, Taoyuan (TW)

( * ) Notice: Subject to any disclaimer, the term of this patent is extended or adjusted under 35 U.S.C. 154(b) by 65 days.

(21) Appl. No.: 17/533,133

(22) Filed: Nov. 23, 2021

(65) Prior Publication Data

US 2022/0166326 A1 May 26, 2022

(30) Foreign Application Priority Data

Nov. 23, 2020 (TW) ................................. 109140905

(51) Int. Cl.
*H02M 3/335* (2006.01)
*H03K 17/0812* (2006.01)
*H02M 1/32* (2007.01)

(52) U.S. Cl.
CPC ......... *H02M 3/33569* (2013.01); *H02M 1/32* (2013.01); *H03K 17/0812* (2013.01)

(58) Field of Classification Search
CPC . H02M 3/33569; H02M 1/32; H03K 17/0812
See application file for complete search history.

(56) References Cited

U.S. PATENT DOCUMENTS

| 5,142,171 | A | | 8/1992 | Nunogawa | |
|---|---|---|---|---|---|
| 5,397,914 | A | | 3/1995 | Suda | |
| 6,087,877 | A | * | 7/2000 | Gonda | ..................... H03K 5/08 327/309 |
| 7,015,681 | B2 | * | 3/2006 | Thiery | .................. H02M 1/088 323/276 |
| 7,327,546 | B2 | * | 2/2008 | Thiery | ............... H03K 17/0822 361/100 |

(Continued)

FOREIGN PATENT DOCUMENTS

| EP | 3 017 542 B1 | 9/2019 |
|---|---|---|
| JP | 2004-32893 | 1/2004 |

(Continued)

OTHER PUBLICATIONS

Sean Long "How to Switch Inductive Loads With Demagnetization" Maxim Integrated, Application Note 6307, https://www.maximintegrated.com/en/design/technical-documents/app-notes/6/6307.html ,Jan. 4, 2017,pp. 1-17.

*Primary Examiner* — Rafael O De Leon Domenech
(74) *Attorney, Agent, or Firm* — Winston Hsu (57) ABSTRACT

A switching circuit includes a power switch, an active clamping circuit, and an active clamping control unit. When the power switch is modulated between an ON state and an OFF with a predetermined frequency, the active clamping control unit is configured to activate the function of the active clamping circuit for absorbing the energy of voltage surges. When the power switch is operating in the ON state or the OFF state, the active clamping control unit is configured to deactivate the function of the active clamping circuit for preventing the counter EMF from damaging the power switch.

11 Claims, 6 Drawing Sheets

(56) References Cited

U.S. PATENT DOCUMENTS

| | | | |
|---|---|---|---|
| 2009/0034298 A1* | 2/2009 | Liu .................... | H02M 3/3376 |
| | | | 363/21.02 |
| 2015/0123637 A1 | 5/2015 | Iwamizu | |
| 2018/0026440 A1* | 1/2018 | Zhao .................... | H02H 9/041 |
| | | | 361/56 |
| 2019/0036446 A1* | 1/2019 | Yang ................. | H02M 3/33569 |
| 2020/0112261 A1* | 4/2020 | Strijker ............. | H02M 3/33546 |

FOREIGN PATENT DOCUMENTS

| | | |
|---|---|---|
| TW | 200746636 | 12/2007 |
| TW | 201338364 A | 9/2013 |
| WO | 2013/084017 A1 | 6/2013 |

* cited by examiner

SWITCHING CIRCUIT WITH CONTROLLABLE ACTIVE CLAMP FUNCTION

CROSS REFERENCE TO RELATED APPLICATION

This application claims priority of Taiwan Application No. 109140905 filed on 2020 Nov. 23.

BACKGROUND OF THE INVENTION

1. Field of the Invention

The present invention is related to a switching circuit with controllable active clamp function, and more particularly, to a switching circuit which controls active clamp function according to the operational status of the power switch.

2. Description of the Prior Art

An electric motor is an electrical machine that converts electrical energy into mechanical energy for driving another device into rotation, vibration or linear movement. The basic structure of a motor includes a rotor and a stator with windings, wherein the rotor is the rotating part of the motor and the stator is the stationary part of the motor. The rotating magnetic field generated by the rotor and the stator is the key principle in the operation of the motor.

According to the law of electromagnetism, the direction of an electromotive force (EMF) induced by the interaction of a magnetic field with an electric circuit must satisfy the Faraday's law of induction and the Lenz's law. Counter-electromotive force (counter EMF) is the electromotive force that opposes the change in current which induced it. Brushless DC motor (BLDCM) and permanent magnet synchronous motor (PMSM) are two of the common types of permanent magnet motors. During the operation of a permanent magnet motor, flux linkage occurs when a magnetic field goes through a coil of wire, which in turns generates a counter EMF having a waveform associated the shape of the permanent magnet. With a fixed number of windings and magnetic flux, the amplitude of the counter EMF is proportional to the angular velocity of the rotor in the motor.

In many motor applications, pulse width modulation (PWM) is often used to modulate the current flowing through the motor for power saving and speed control purposes. PWM is a technique that mitigates the average amount of deliverable power of an applied electrical signal by rapidly turning on and off a power switch. The ratio of the power-delivery time in a period is determined by a duty cycle which in the ratio of time the power switch is ON compared to the time the power switch is OFF. The leakage inductance of the transformer and/or the stray capacitance/inductance energy of the lines may cause switching loss, noises and switching stress when the power switch is modulated between the ON state and the OFF state. A sudden voltage surge occurs across the power switch at the moment the power switch is turned off and increases the voltage stress of the power switch since the value of the voltage surge exceeds the nominal input voltage of the power switch. A sudden current surge flows through the bypass capacitor of the power switch at the moment the power switch is turned on and increases the current stress of the power switch since the value of the current surge exceeds the nominal input current of the power switch. In order to suppress the voltage surge and the current surge during hard-switching of the power switch, an active clamp technique which uses a clamp circuit to absorb the energy of the leakage inductance of the transformer and/or the stray capacitance/inductance energy of the lines is normally adopted, thereby improving the overall efficiency and high-frequency interferences.

As previously stated, the counter EMF induced during the high-speed operation of the motor is a large amount of energy generated during a longer period (on the scale of milliseconds), and the voltage surge caused by hard-switching is a small amount of energy generated during a shorter period (on the scale of microseconds). If the active clamp function is activated when the counter EMF is present, the large energy of the counter EMF may damage the power switch and cause failure in motor driving.

SUMMARY OF THE INVENTION

The present invention provides a switching circuit with controllable active clamp function and includes a first node, a second node, a third node, a power switch, a driving circuit, an active clamping circuit and an active clamping control unit. The power switch includes a first end coupled to the first node, a second end coupled to the second node, and a control end for receiving a first control signal which includes a predetermined frequency and a state-switching frequency. The driving circuit is configured to provide the first control signal, modulate the power switch to operate between an ON state and an OFF state with the predetermined frequency when the state-switching frequency is larger than the predetermined frequency, and control the power switch to operate in the ON state or the OFF state when the state-switching frequency is equal to the predetermined frequency. The active clamping circuit is coupled between the first node and the third node and configured to provide a clamp voltage at the third node according to a voltage established across the active clamping circuit. The active clamping control unit is configured to allow the clamp voltage to be transmitted to the control end of the power switch during a period when the power switch is modulated between the ON state and the OFF state with the predetermined frequency, and prevent the clamp voltage from being transmitted to the control end of the power switch during a period when the power switch operates in the OFF state.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-4 are diagrams illustrating switching circuits 101-104 with controllable active clamp function according to embodiments of the present invention. Each of the switching circuits 101-104 includes a power switch Q1, a driving circuit 10, an active clamping circuit 20, an active clamping control unit 30, and a resistor Rg. For illustrative purpose, $V_{CE}$ represents the voltage established across the power switch Q1, $I_{CE}$ represents the current flowing through the power switch Q1, V1 represents the voltage established across the active clamping circuit 20, N1-N3 represents the nodes in each switching circuit, and $V_{BUS}$ represents the voltage supplied to the node N1.

In the switching circuits 101-104, each power switch Q1 includes a first end coupled to the first node N1, a second end coupled to the second node N2, and a control end coupled to the driving circuit 10 via the resistor Rg for receiving a control signal VG1. The driving circuit 10 is configured to provide the control signal VG1 according to a supply voltage $V_{DC}$, thereby selectively turning on or turning off the power switch Q1. The power switch Q1 may operate in an ON state or in an OFF state. When operating in the ON state, the first end and the second end of the power switch Q1 are essentially short-circuited, thereby conducting the current $I_C(I_C>0)$ and transmitting the energy stored at the node N1 to the node N2. When operating in the OFF state, the first end and the second end of the power switch Q1 are essentially open-circuited, thereby cutting off the current $I_C(I_C=0)$ and thus disconnecting the node N1 from the node N2.

The control signal may be a square wave which includes a predetermined frequency and a state-switching frequency, wherein a periodical signal may switch between a high level and a low level with the state-switching frequency, another periodical signal may switch between a high level and a low level with the predetermined frequency, and the state-switching frequency is substantially higher than the predetermined frequency. In an embodiment, when the state-switching frequency is larger than the predetermined frequency in the control signal VG1, the driving circuit 10 is configured to modulate the power switch Q1 to operate between the ON state and the OFF state with the predetermined frequency; when the state-switching frequency is equal to the predetermined frequency in the control signal VG1, the driving circuit 10 is configured to operate the power switch Q1 in the ON state and in the OFF state. When operating in the stable state of constantly turning on or off, counter EMF may be present in the non-operational power switch Q1.

The moment the power switch Q1 switches from the ON state to the OFF state, the value of the current $I_C$ begins to decrease due to the turned-off (open-circuited) power switch Q1. Under such circumstance, the leakage inductance energy of the transformer and/or the stray capacitance/inductance energy of the lines and devices need to be released, causing the voltage $V_{CE}$ to rise rapidly and creating a voltage surge $V_{SP}$ at the node N1. The amount of time required to release the above-mentioned energy is determined by the state-switching frequency in the control signal VG1.

In order to alleviate the voltage stress caused by the voltage surge $V_{SP}$ during high-frequency switching, the present switching circuits 101-104 may absorb the energy of the voltage surge $V_{SP}$ using the active clamping circuit 20, thereby improving the overall efficiency and high-frequency electromagnetic interference. Meanwhile, the active clamping control unit 30 is configured to activate or deactivate the active clamp function of the active clamping circuit 20 according to the operational status of the power switch Q1. This way, the active clamp function of the active clamping circuit 20 may be deactivated during the occurrence of high-energy counter EMF, thereby preventing the power switch Q1 from being damaged.

In the switching circuits 101-104, each active clamping circuit 20, coupled between the node N1 and the node N3, is configured to provide a clamp voltage $V_{CLAMP}$ according to the corresponding voltage V1 established across each active clamping circuit 20. When the voltage level of the node N1 is sufficiently high so that the voltage V1 established across the active clamping circuit 20 exceeds its threshold voltage $V_{TH}$, the clamp voltage $V_{CLAMP}$ is at an enable level; when the voltage level of the node N1 is not sufficiently high so that the voltage V1 established across the active clamping circuit 20 does not exceed its threshold voltage $V_{TH}$, the clamp voltage $V_{CLAMP}$ has a floating level.

In the embodiments illustrated in FIGS. 1-4, the active clamping circuit 20 includes a Zener diode ZD and a unidirectional diode D1, and its threshold voltage $V_{TH}$ is the sum of the breakdown voltage of the Zener diode ZD and the forward-bias voltage of the unidirectional diode D1. The cathode of the Zener diode ZD is coupled to the node N1, the anode of the Zener diode ZD is coupled to the anode of the unidirectional diode D1, and the cathode of the unidirectional diode D1 is coupled to node N3. When the voltage V1 is larger than the threshold voltage $V_{TH}$ of the active clamping circuit 20, the Zener diode ZD breaks down and starts conducting current, and the forward-biased unidirectional diode D1 starts conducting current, thereby establishing the clamp voltage $V_{CLAMP}$ having a stable enable level, wherein the value of the clamp voltage $V_{CLAMP}$ is the sum of the breakdown voltage of the Zener diode ZD and the forward-bias voltage of the unidirectional diode D1. When the voltage V1 is not larger than the threshold voltage $V_{TH}$ of the active clamping circuit 20, the Zener diode ZD is cut off, and the clamp voltage $V_{CLAMP}$ has a floating level.

In the switching circuits 101-104, the active clamping control unit 30, coupled between the node N3 and the control end of the power switch Q1, is configured to control the signal transmission path between the node N3 and the control end of the power switch Q1 according to the operational status of the power switch Q1. As previously stated, when the power switch Q1 switches from the ON state to the OFF state with the predetermined frequency, the voltage surge $V_{SP}$ generated at the node N1 is sufficiently high so that the voltage V1 established across the active clamping circuit 20 exceeds its threshold voltage $V_{TH}$, thereby establishing the clamp voltage $V_{CLAMP}$ having a stable enable level at the node N3. When the active clamping control unit 30 allows the clamp voltage $V_{CLAMP}$ having a stable enable level to be transmitted to the control end of the turned-off power switch Q1, the power switch Q1 may be turned on for a period in order to absorb the energy of the voltage surge $V_{SP}$.

Figure 1:
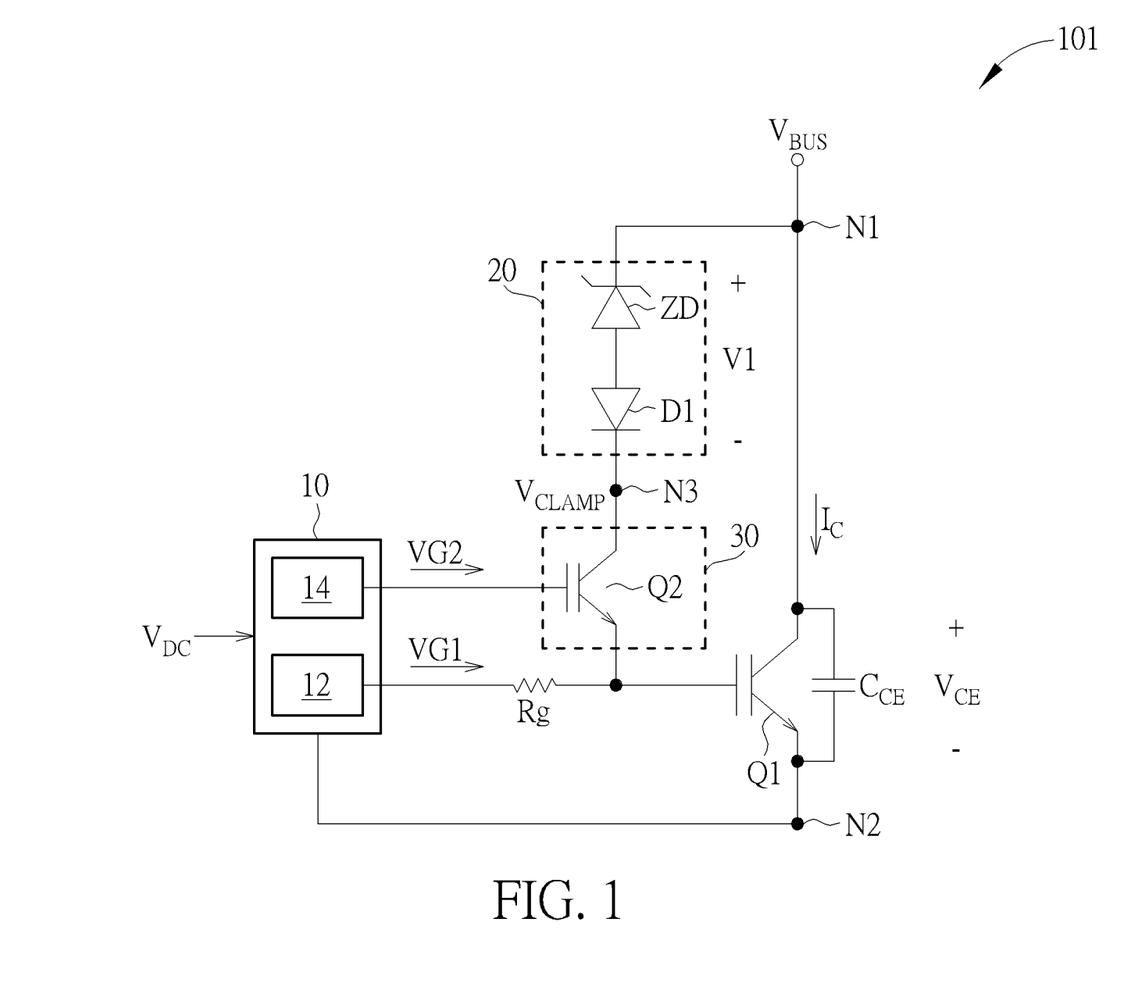
FIG. 1 is a diagram illustrating a switching circuit with controllable active clamp function according to an embodiment of the present invention.

In the switching circuit 101 depicted in FIG. 1, the active clamping control unit 30 includes an auxiliary switch Q2 having a first end coupled to the node N3, a second end coupled to the control end of the power switch Q1, and a control end for receiving a control signal VG2. The driving circuit 10 may include two logic units 12 and 14 configured to generate the control signals VG1 and VG2, respectively. In an embodiment, during the switching of operational states with the predetermined frequency, the control signals VG1 and VG2 have opposite logic states. More specifically, when the power switch Q1 switches from the ON state to the OFF state in response to the control signal VG1, the auxiliary switch Q2 switches from the OFF state to the ON state in response to the control signal VG2. Under such circumstance, the clamp voltage $V_{CLAMP}$ having a stable enable level may be transmitted to the control end of the power switch Q1, thereby turning on the power switch Q1 for a period in order to absorb the energy of the voltage surge $V_{SP}$.

In another embodiment of the switching circuit 101 depicted in FIG. 1, when the switching circuit 10 is used to drive a motor, the active clamping control unit 30 may determine whether the power switch Q1 is modulated between the ON state and the OFF state with the predetermined frequency according to the time inverted by the predetermined frequency. When determining that the power switch Q1 is not modulated between the ON state and the OFF state with the predetermined frequency, it indicates that the power switch Q1 has been turned off by the control signal VG1. The auxiliary switch Q2 may be turned off by the control signal VG2 in order to prevent the counter EMF from damaging the power switch Q1.

In another embodiment of the switching circuit 101 depicted in FIG. 1, the control signal VG2 generated by the logic unit 14 may be an inverting logic and time-delayed signal of the control signal VG1. More specifically, when the power switch Q1 switches from the ON state to the OFF state in response to the control signal VG1, the auxiliary switch Q2 switches from the OFF state to the ON state and continues to operate in the ON state in response to the control signal VG2. This way, the auxiliary switch Q2 may function during the occurrence of the voltage surge $V_{SP}$ for transmitting the clamp voltage $V_{CLAMP}$ having a stable enable level to the control end of the power switch Q1, so that the power switch Q1 may absorb the energy of the voltage surge $V_{SP}$ after being turned on for a period of time.

Figure 2:
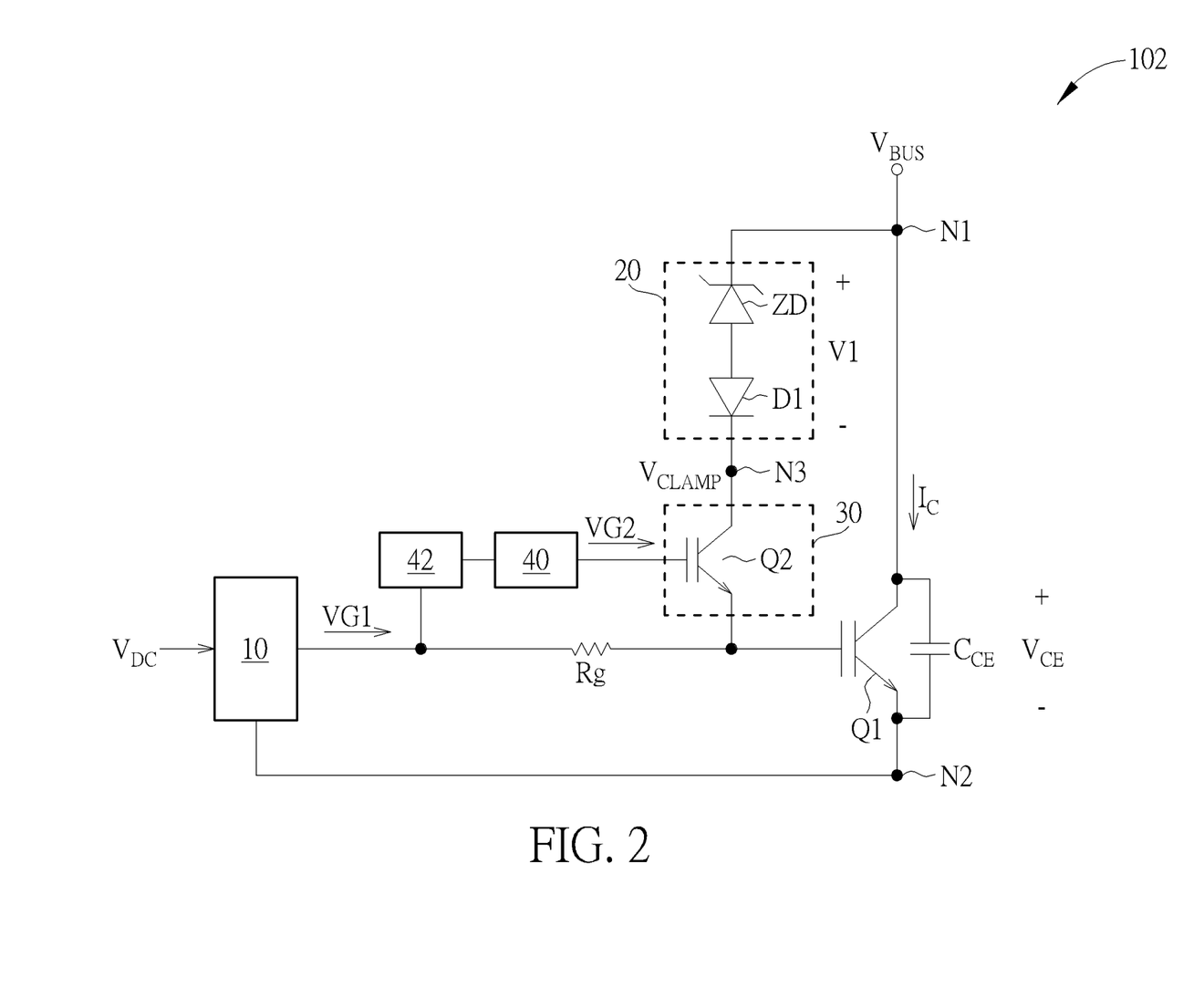
FIG. 2 is a diagram illustrating a switching circuit with controllable active clamp function according to another embodiment of the present invention.

In the switching circuit 102 depicted in FIG. 2, the active clamping control unit 30 includes an auxiliary switch Q2 having a first end coupled to the node N3, a second end coupled to the control end of the power switch Q1, and a control end for receiving a control signal VG2. The switching circuit 102 further includes an inverting logic circuit 40 and a high-pass filter 42. The high-pass filter 42 is coupled between the inverting logic circuit 40 and the driving circuit 10 for detecting the state-switching frequency in the control signal VG1. The inverting logic circuit 40 is configured to generate the control signal VG2 by inverting the phase of the control signal VG1 when the high-pass filter 42 detects the state-switching frequency. More specifically, when the power switch Q1 switches from the ON state to the OFF state in response to the control signal VG1, the auxiliary switch Q2 switches from the OFF state to the ON state in response to the control signal VG2. Under such circumstance, the clamp voltage $V_{CLAMP}$ having a stable enable level may be transmitted to the control end of the power switch Q1, thereby turning on the power switch Q1 for absorbing the energy of the voltage surge $V_{SP}$. When the power switch Q1 is not modulated between the ON state and the OFF state with the predetermined frequency, it indicates that the power switch Q1 has be turned off by the control signal VG1 and no state-switching frequency is present in the control signal VG1. Under such circumstance, since the high-pass filter 42 does not detect any state-switching frequency in the control signal VG1, the auxiliary switch Q2 is kept in the OFF state by the control signal VG2.

Figure 3:
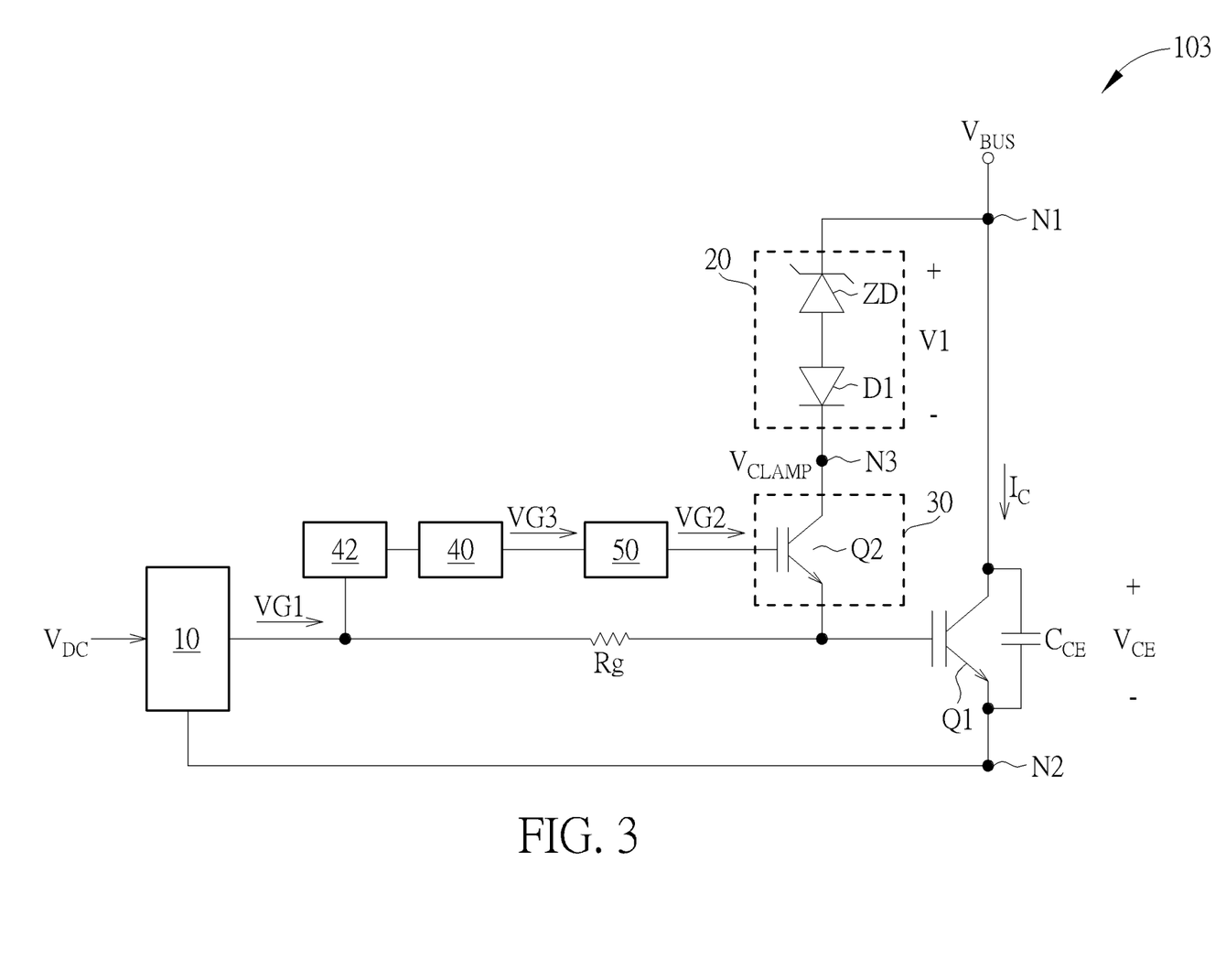
FIG. 3 is a diagram illustrating a switching circuit with controllable active clamp function according to another embodiment of the present invention.

In the switching circuit 103 depicted in FIG. 3, the active clamping control unit 30 includes an auxiliary switch Q2 having a first end coupled to the node N3, a second end coupled to the control end of the power switch Q1, and a control end for receiving a control signal VG2. The switching circuit 103 further includes an inverting logic circuit 40, a high-pass filter 42 and a delay circuit 50. The high-pass filter 42 is coupled between the inverting logic circuit 40 and the driving circuit 10 for detecting the state-switching frequency in the control signal VG1. When the high-pass filter 42 detects the state-switching frequency in the control signal VG1, the inverting logic circuit 40 is configured to generate the control signal VG3 by inverting the phase of the control signal VG1. The delay circuit 50 is configured to generate the control signal VG2 by time-delaying the phase of the control signal VG3, wherein the control signal VG2 is the inverting logic and time-delayed signal of the control signal VG1. More specifically, when the power switch Q1 switches from the ON state to the OFF state in response to the control signal VG1, the auxiliary switch Q2 switches from the OFF state to the ON state and continues to operate in the ON state in response to the control signal VG2. This way, the auxiliary switch Q2 may function during the occurrence of the voltage surge $V_{SP}$ for transmitting the clamp voltage $V_{CLAMP}$ having a stable enable level to the control end of the power switch Q1, so that the power switch Q1 may absorb the energy of the voltage surge $V_{SP}$ after being turned on for a period of time. When the power switch Q1 is not modulated between the ON state and the OFF state with the predetermined frequency, it indicates that the power switch Q1 has be turned off by the control signal VG1 and no state-switching frequency is present in the control signal VG1. Under such circumstance, since the high-pass filter 42 does not detect any state-switching frequency in the control signal VG1, the auxiliary switch Q2 is kept in the OFF state by the control signal VG2.

Figure 4:
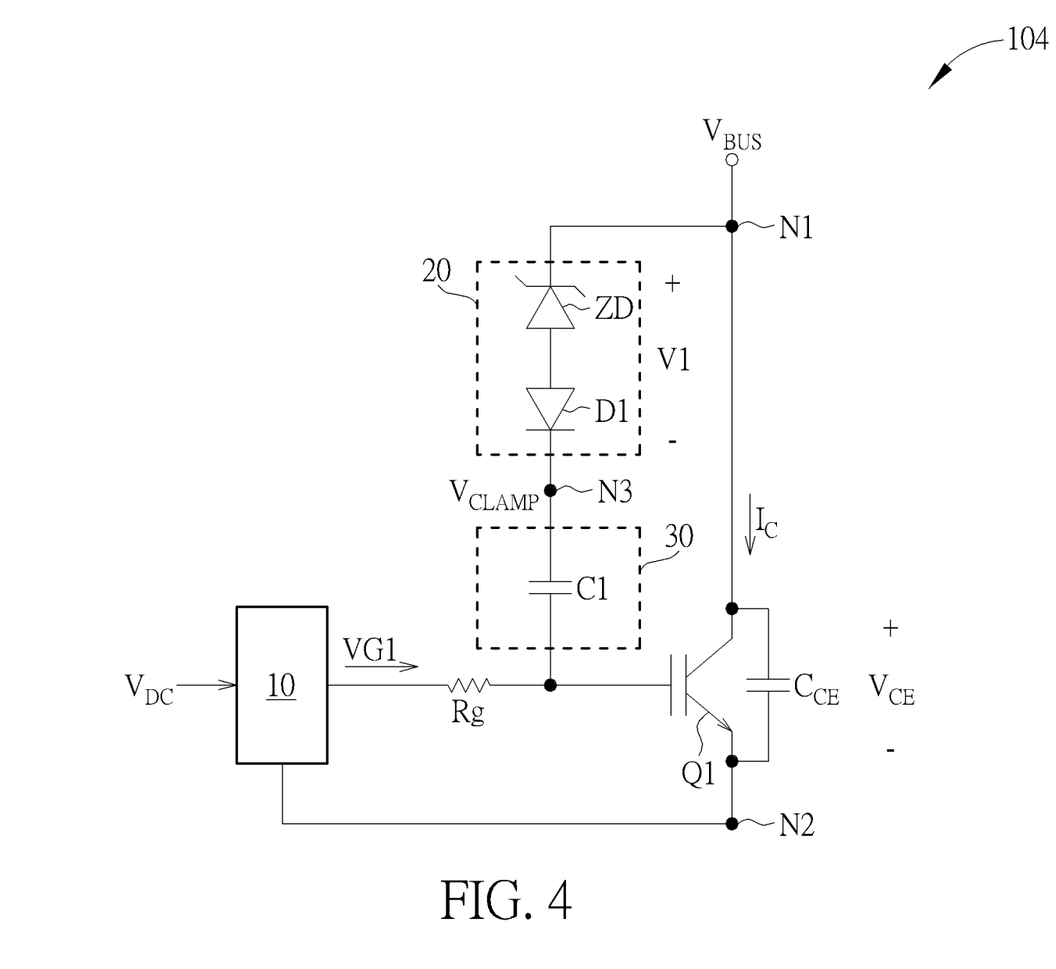
FIG. 4 is a diagram illustrating a switching circuit with controllable active clamp function according to another embodiment of the present invention.

In the embodiment depicted in FIG. 4, the active clamp unit 30 includes a capacitor C1. The capacitor C1 and the resistor Rg form a high-pass filter. As previously stated, the voltage $V_{BUS}$ at the node N1 is associated with the voltage $V_{CE}$ established across the power switch Q1, and the variation in the clamp voltage $V_{CLAMP}$ is associated with the value of the voltage $V_{BUS}$. In the stable state when the power switch Q1 is fully turned on, the voltage $V_{CE}$ is kept at a constant level higher than zero. In the stable state when the power switch Q1 is fully turned off, the value of the voltage $V_{CE}$ is zero. In a high-frequency switching state when the power switch Q1 is modulated between the ON state and the OFF state, the value of the voltage $V_{CE}$ varies with the switching frequency accordingly. In other words, when the power switch Q1 operates in a stable state, the voltage $V_{BUS}$ and the clamp voltage $V_{CLAMP}$ are stable low-frequency signals which are blocked by the high-pass filter formed by the capacitor C1 and the resistor Rg, and the power switch Q1 remains operating in the current OFF state since the voltage $V_{BUS}$ and the clamp voltage $V_{CLAMP}$ are prevented from being transmitted to the control end of the power switch Q1. When the power switch Q1 operates in a high-frequency switching state, the voltage $V_{BUS}$ and the clamp voltage $V_{CLAMP}$ are high-frequency signals each including the predetermined frequency and the state-switching frequency. When the state-switching frequency is present, the voltage level of the node N3 may be transmitted to the control end of the power switch Q1 via the high-pass filter formed by the capacitor C1 and the resistor Rg, thereby turning on the power switch Q1 for a period of time for absorbing the energy of the voltage surge $V_{SP}$.

Figure 5:
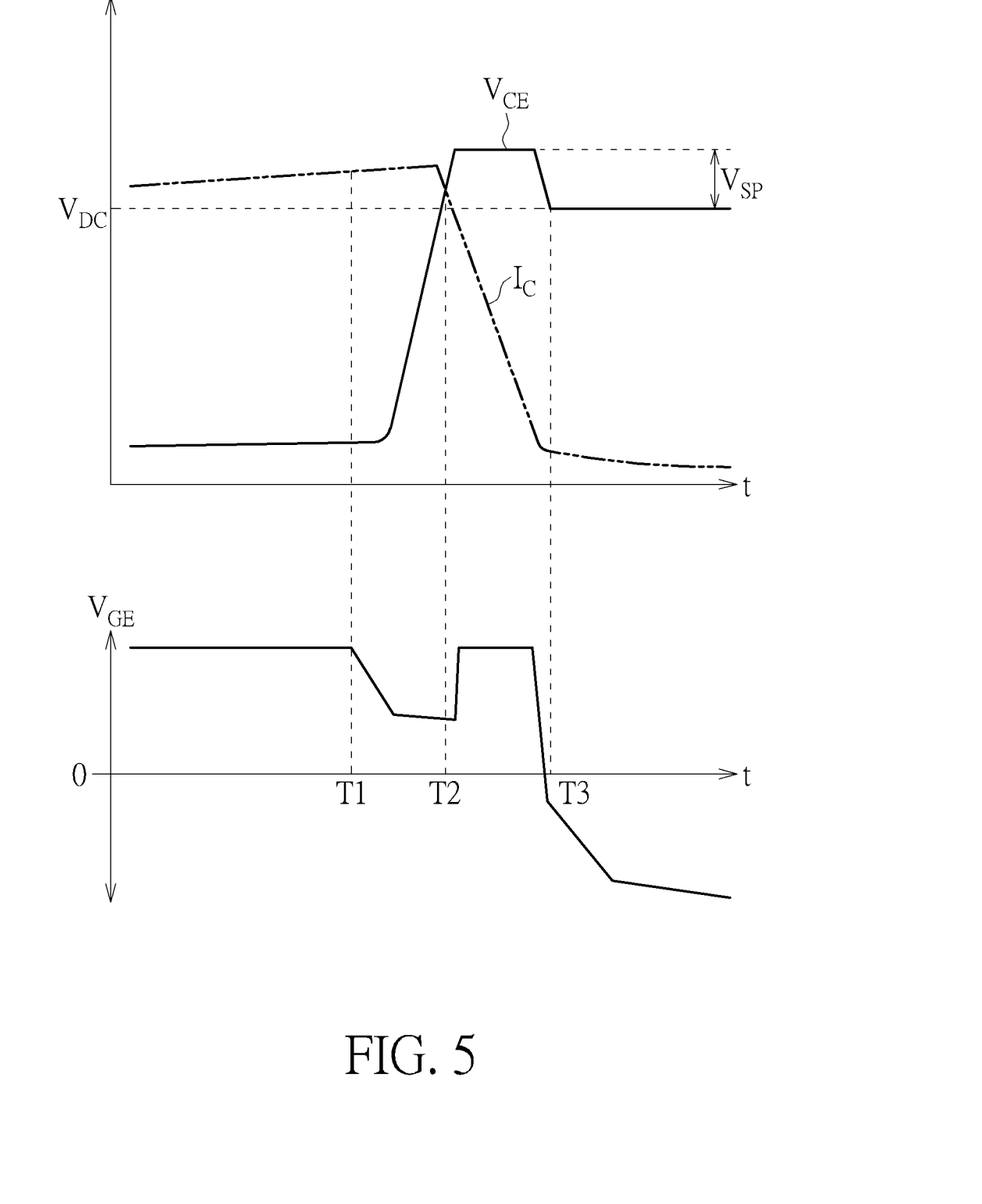
FIG. 5 is a diagram illustrating the waveforms of related signals during the operation of a switching circuit with controllable active clamp function according to an embodiment of the present invention.

FIG. 5 is a diagram illustrating the waveforms of related signals during the operation of the switching circuits 101-104 with controllable active clamp function according to embodiments of the present invention. The waveforms of the voltage $V_{CE}$ established across the power switch Q1 and the current $I_{CE}$ flowing through the power switch Q1 are depicted on the top of FIG. 5. The waveforms of the voltage $V_{GE}$ between the control end and the second end of the power switch Q1 is depicted on the bottom of FIG. 5. When the power switch Q1 switches from the ON state to the OFF state at the time point T1, the rapid raise in the voltage $V_{CE}$ results in the voltage surge $V_{SP}$ which causes the voltage $V_{CE}$ to exceed the nominal value of the voltage $V_{DC}$ ($V_{CE}=V_{DC}+V_{SP}$). At the time point T2 when the voltage $V_{CE}$ is sufficiently high so that the voltage V1 established across the active clamping circuit 20 is larger than its threshold voltage $V_{TH}$, the active clamping control unit 30 is configured to allow the clamp voltage $V_{CLAMP}$ having a stable enable level to be transmitted to the control end of the power switch Q1 for turning on the power switch Q1. This way, the energy of the voltage surge $V_{SP}$ may be absorbed between T1 and T2 so that the voltage $V_{CE}$ may return to the nominal value of the voltage $V_{DC}$ (after the time point T3).

In an embodiment of the present invention, each of the power switch Q1 and the auxiliary switch Q2 may be a metal-oxide-semiconductor field-effect transistor (MOSFET), a bipolar junction transistors (BJT), or any other device having similar function. For N-type transistors, the enable level is logic 1, and the disable level is logic 0; for P-type transistors, the enable level is logic 0, and the disable level is logic 1. FIGS. 1-4 depict the embodiment of BJTs. However, the types of the power switch Q1 and the auxiliary switch Q2 do not limit the scope of the present invention.

In an embodiment of the present invention, the switching circuits 101-104 may be applied to a flyback power converter, wherein the node N1 is coupled to the primary winding of the transformer, and the energy conversion ratio between the secondary winding and the primary winding of the transformer may be adjusted by modulating the power switch Q1. In an embodiment of the present invention, the switching circuits 101-104 may be applied to a motor driving circuit, wherein the output of its high-side and low-side by modulating the power switch Q1. However, the application field of the switching circuits 101-104 does not limit the scope of the present invention.

Figure 6:
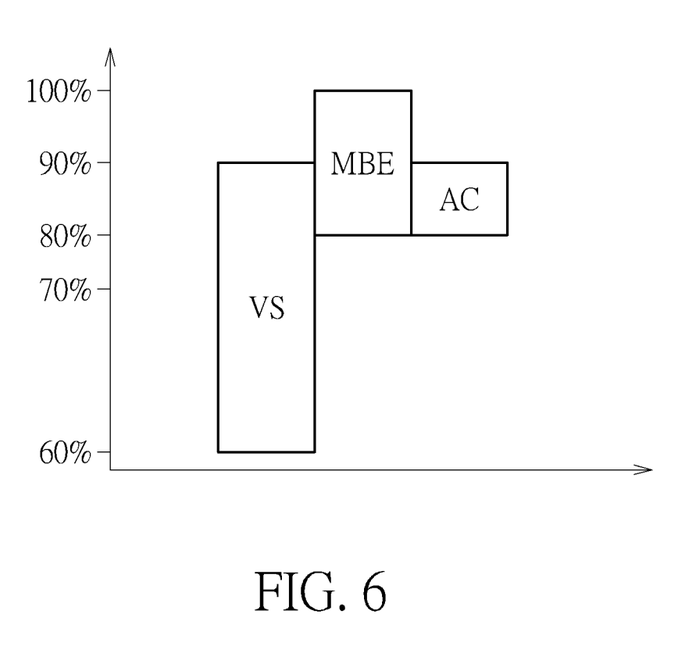
FIG. 6 is a diagram illustrating the operational status of a switching circuit with controllable active clamp function according to an embodiment of the present invention.

FIG. 6 is a diagram illustrating the operational status of the switching circuits 101-104 with controllable active clamp function according to embodiments of the present invention. For illustrative purpose, it is assumed that the minimal rated operational voltage of a device which adopts any of the switching circuit 101-104 is equal to 60% of the maximum withstand voltage of the power switch Q1, the maximum rated operational voltage of the device which adopts any of the switching circuit 101-104 is equal to 70% of the maximum withstand voltage of the power switch Q1, and the rated withstand voltage of the power switch Q1 is equal to 90% of its maximum withstand voltage. VS represents the period during which voltage surges may occur, MBE represents the period during which counter EMF may occur, and AC represents the period during which the active clamp function of the switching circuit 101-104 is activated. As previously stated, when the operational voltage exceeds the maximum voltage peak, the present switching circuits 101-104 activate the active clamp function; when counter EMF is induced as the operational voltage exceeds the rated withstand voltage of the power switch Q1, the present switching circuits 101-104 deactivate the active clamp function.

In conclusion, in the switching circuit of the present invention, the active clamping control unit is configured to selective activate or deactivate the active clamp function according to the operational status of the power switch. When the power switch is modulated between an ON state and an OFF with a high frequency, the active clamping control unit is configured to activate the function of the active clamping circuit for absorbing the energy of voltage surges. When the power switch is operating in the ON state or the OFF state, the active clamping control unit is configured to deactivate the function of the active clamping circuit for preventing the counter EMF from damaging the power switch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switching circuit with controllable active clamp function, comprising:
    a first node;
    a second node;
    a third node;
    a power switch, comprising:
        a first end coupled to the first node;
        a second end coupled to the second node; and
        a control end for receiving a first control signal which includes a predetermined frequency and a state-switching frequency;
    a driving circuit configured to:
        provide the first control signal;
        modulate the power switch to operate between an ON state and an OFF state with the predetermined frequency when the state-switching frequency is larger than the predetermined frequency; and
        control the power switch to operate in the ON state or the OFF state when the state-switching frequency is equal to the predetermined frequency;
    an active clamping circuit coupled between the first node and the third node and configured to provide a clamp voltage at the third node according to a voltage established across the active clamping circuit; and
    an active clamping control unit configured to:
        allow the clamp voltage to be transmitted to the control end of the power switch during a period when the power switch is modulated between the ON state and the OFF state with the predetermined frequency; and
        prevent the clamp voltage from being transmitted to the control end of the power switch during a period when the power switch operates in the OFF state.

2. The switching circuit of claim 1, wherein:
    the driving circuit comprises:
        a first logic unit configured to generate the first control signal; and
        a second logic unit configured to generate a second control signal;
    the active clamping control unit comprises an auxiliary switch which includes:
        a first end coupled to the third node;
        a second end coupled to the control end of the power switch; and a control end for receiving the second control signal; and a logic state of the first control signal is opposite to a logic state of the second control signal.

3. The switching circuit of claim 1, wherein:

the driving circuit comprises:
  a first logic unit configured to generate the first control signal; and
  a second logic unit configured to generate a second control signal;

the active clamping control unit comprises an auxiliary switch which including:
  a first end coupled to the third node;
  a second end coupled to the control end of the power switch; and
  a control end for receiving the second control signal; and the second control signal is an inverting logic and time-delayed signal of the first control signal.

4. The switching circuit of claim 1, wherein the active clamping control unit comprises:
  a high-pass filter configured to detect the state-switching frequency in the first control signal;
  an inverting logic circuit configured to generate a third control signal by inverting a phase of the first control signal when the high-pass filter detects the state-switching frequency; and
  an auxiliary switch including:
    a first end coupled to the third node;
    a second end coupled to the control end of the power switch; and
    a control end for receiving the second control signal.

5. The switching circuit of claim 1, wherein the active clamping control unit comprises:
  a high-pass filter configured to detect the state-switching frequency in the first control signal;
  an inverting logic circuit configured to generate a third control signal by inverting a phase of the first control signal when the high-pass filter detects the state-switching frequency;
  a delay circuit configured to generate a second control signal by time-delaying a phase of the third control signal; and
  an auxiliary switch including:
    a first end coupled to the third node;
    a second end coupled to the control end of the power switch; and
    a control end for receiving the second control signal.

6. The switching circuit of claim 1, further comprising a resistor coupled between the driving circuit and the control end of the power switch.

7. The switching circuit of claim 6, wherein the active clamping control unit further comprises a capacitor having a first end coupled to the third node and a second end coupled between the resistor and the control end of the power switch.

8. The switching circuit of claim 7, wherein:
  the capacitor and the resistor form a high-pass filter which is configured to allow the clamp voltage to be transmitted to the control end of the power switch when a frequency of the clamp voltage is not smaller than the predetermined frequency; and
  the high-pass filter is configured to prevent the clamp voltage from being transmitted to the control end of the power switch when the frequency of the clamp voltage is smaller than the predetermined frequency.

9. The switching circuit of claim 1, wherein the active clamping circuit comprises:
  a Zener diode including:
    an anode; and
    a cathode coupled to the first node; and
  a unidirectional diode including:
    an anode coupled to the anode of the Zener diode; and
    a cathode coupled to the third node.

10. The switching circuit of claim 1, wherein the active clamping control unit is further configured to:
  prevent the clamp voltage from being transmitted to the control end of the power switch during a period when the power switch is not modulated between the ON state and the OFF state with the predetermined frequency.

11. The switching circuit of claim 1, wherein the active clamping control unit is further configured to:
  determine whether the power switch is modulated between the ON state and the OFF state with the predetermined frequency according to a time inverted by the predetermined frequency; and
  prevent the clamp voltage from being transmitted to the control end of the power switch when determining that the power switch is not modulated between the ON state and the OFF state with the predetermined frequency.

* * * * *